(12) United States Patent
Kavalipurapu et al.

(10) Patent No.: US 10,741,260 B1
(45) Date of Patent: Aug. 11, 2020

(54) SYSTEMS AND METHODS PROVIDING IMPROVED CALIBRATION OF MEMORY CONTROL VOLTAGE

(71) Applicant: Micron Technology, Inc., Boise, ID (US)

(72) Inventors: Kalyan Kavalipurapu, Santa Clara, CA (US); Michele Piccardi, Cupertino, CA (US); Xiaojiang Guo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/424,448

(22) Filed: May 28, 2019

(51) Int. Cl.
| | |
|---|---|
| *G11C 11/56* | (2006.01) |
| *G11C 16/32* | (2006.01) |
| *G11C 16/30* | (2006.01) |
| *G11C 16/04* | (2006.01) |
| *G11C 16/26* | (2006.01) |
| *G11C 16/08* | (2006.01) |
| *G11C 16/10* | (2006.01) |

(52) U.S. Cl.
CPC .......... *G11C 16/30* (2013.01); *G11C 16/0483* (2013.01); *G11C 16/08* (2013.01); *G11C 16/10* (2013.01); *G11C 16/26* (2013.01); *G11C 11/5621* (2013.01); *G11C 11/5671* (2013.01)

(58) Field of Classification Search
CPC .................. G11C 11/4076; G11C 7/02; G11C 2211/4061; G11C 29/023; G11C 16/04; G11C 16/10; G11C 18/18; G11C 16/0483; G11C 11/40; G11C 16/12; G11C 16/26; G11C 16/34; G11C 16/08; G11C 16/28; G11C 7/062
See application file for complete search history.

(56) References Cited

U.S. PATENT DOCUMENTS

| | | | |
|---|---|---|---|
| 9,529,663 B1 * | 12/2016 | Srinivasan | G11C 16/3445 |
| 9,747,992 B1 * | 8/2017 | Chen | G11C 16/26 |
| 9,830,963 B1 * | 11/2017 | Pang | H01L 27/11582 |
| 2008/0130341 A1 * | 6/2008 | Shalvi | G11C 11/56 365/45 |
| 2010/0073069 A1 * | 3/2010 | Wang | G11C 5/143 327/513 |
| 2020/0027503 A1 * | 1/2020 | Chen | G11C 8/12 |

* cited by examiner

*Primary Examiner* — Hien N Nguyen
(74) *Attorney, Agent, or Firm* — Greenberg Traurig

(57) ABSTRACT

Disclosed are systems and methods of dynamically calibrating a memory control voltage more accurately. According to disclosed implementations, a memory control voltage such as Vpass or Vwlrv may be calibrated during memory operation as a function of the change in slope of total string current, even during increase in the wordline voltage. In one exemplary method, the wordlines are increased in sequence from a start voltage to an end voltage in steps, slope change is measured at every step, the measured slope change is compared against a threshold, and an adjusted memory control voltage is determined as a function of a wordline voltage at which the change in slope reaches the threshold. As such, memory control voltage may be determined and dynamically calibrated with less sensitivity to operating parameters such as temperature, pattern, and/or time of programming.

26 Claims, 8 Drawing Sheets

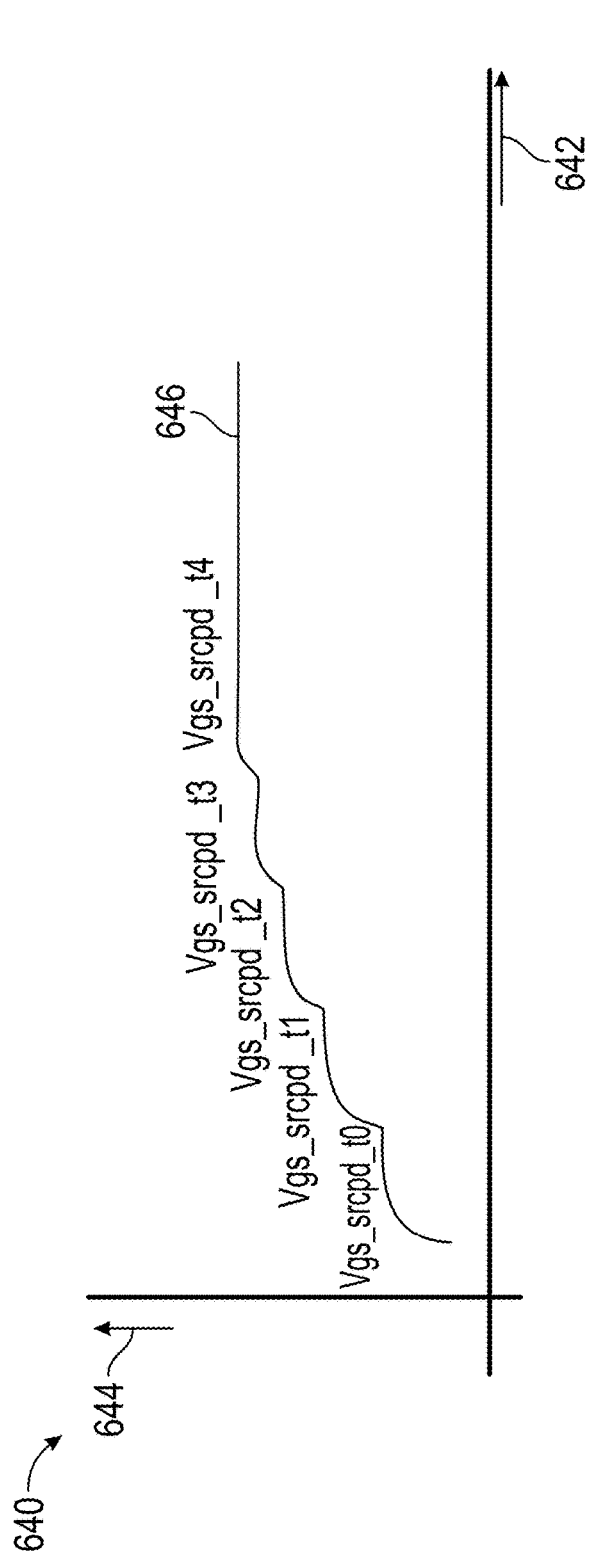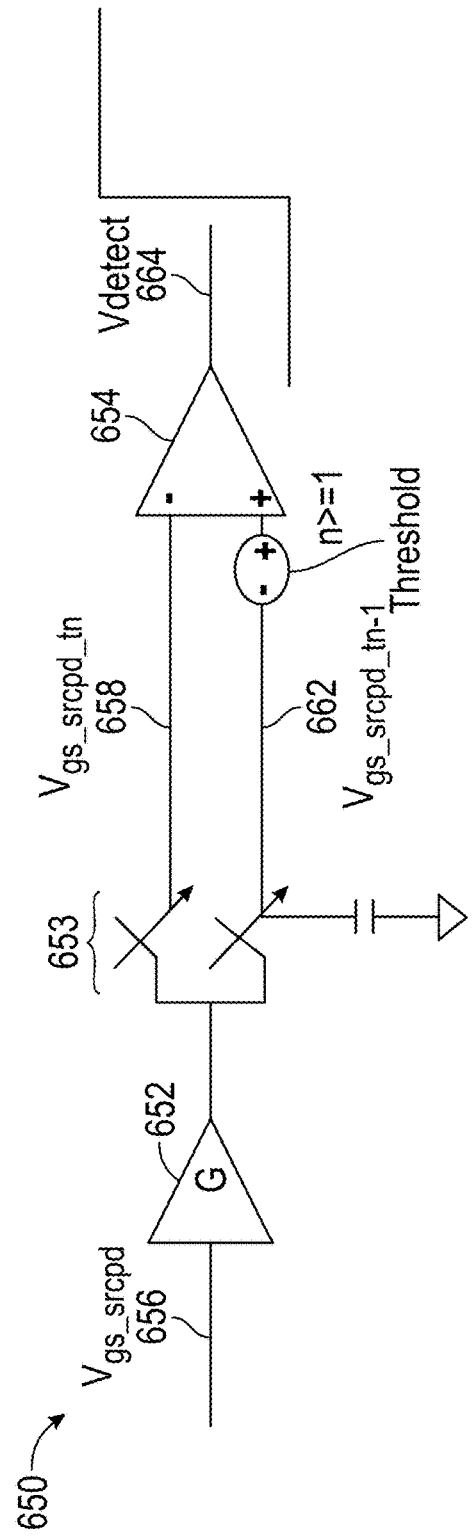
FIG. 6B
FIG. 6C

SYSTEMS AND METHODS PROVIDING IMPROVED CALIBRATION OF MEMORY CONTROL VOLTAGE

TECHNICAL FIELD

The present disclosure relates generally to multi-level memory operation, and more particularly, to systems and methods of dynamically calibrating memory control voltage with less sensitivity to fluctuations in operating parameters such as temperature, pattern, and/or time of programming.

BACKGROUND

Dynamic calibration of pass voltage (Vpass) and wordline read-verify voltage (Vwlrv) is performed during certain memory operations, such as page read, to account for charge loss in distributions with ageing, for example. Existing systems that dynamically calibrate such voltages often perform calibration as a function of the average string current in the memory sub-blocks. Drawbacks of approaches like this can include undesired sensitivity to temperature changes and/or time of programming requirements. For example, since temperature compensation is only done at the desired sense current or sense Vt (threshold voltage), i.e., the voltage at which the cells are sensed as erased or programmed, temperature-induced variation of cell current from cells not at sense Vt can cause inaccuracy in voltage calculation and resulting calibration. Moreover, if different pages or sub-blocks are programmed at different times, inaccurate calibration of dynamic pass voltage or wordline read-verify voltage may occur due to high currents from unselected sub-blocks. This is because unselected sub-block segmentation or turn-off cannot be done until the final pass voltage is determined, which happens after the comparator flips indicating completion of calibration.

Approaches that dynamically calibrate pass voltage as a function of current passing through sub-blocks may also suffer from undesired fluctuation based on the pattern of programming. Here, for example, variation in quantity and/or location of pages programmed may affect calibration, since the average string current expected is a function of the number of pages programmed per block.

The disclosed technology provides improved calibration of pass voltage or wordline read-verify voltage by reducing sensitivity to temperature, pattern, and time of programming issues and/or addressing other deficiencies in the prior art.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

FIG. 6B depicts a representative waveform associated with such second memory system implementation according to further embodiments of the disclosure.

FIG. 6C depicts another circuit diagram associated with such second memory system implementation according to further embodiments of the disclosure.

DETAILED DESCRIPTION

The following disclosure describes various embodiments of improved systems and methods for dynamically calibrating memory control voltages, such as pass voltage and/or wordline read-verify voltage, more accurately. According to disclosed implementations, voltages are calibrated during memory operation based on a change in the curve of string current as a function of time, where the change in slope is calculated from the ratio in change of the total string current over a corresponding change in time, i.e., the rate of change in the total string current (also referred to as current 'roll-off'), as measured during increase in wordline voltages, for example. In one exemplary method, the wordlines are increased in sequence from a start voltage to an end voltage in steps, the change in slope is measured at every step, the measured slope change is compared against a threshold, and an adjusted/final voltage is determined based on the wordline voltage level at which the current roll-off reaches (e.g., falls below, etc.) the threshold. Accordingly, memory control voltage may be determined and dynamically calibrated with less sensitivity to changes in various operating parameters, such as fluctuations in temperature, pattern, and/or time of programming.

Figure 1:
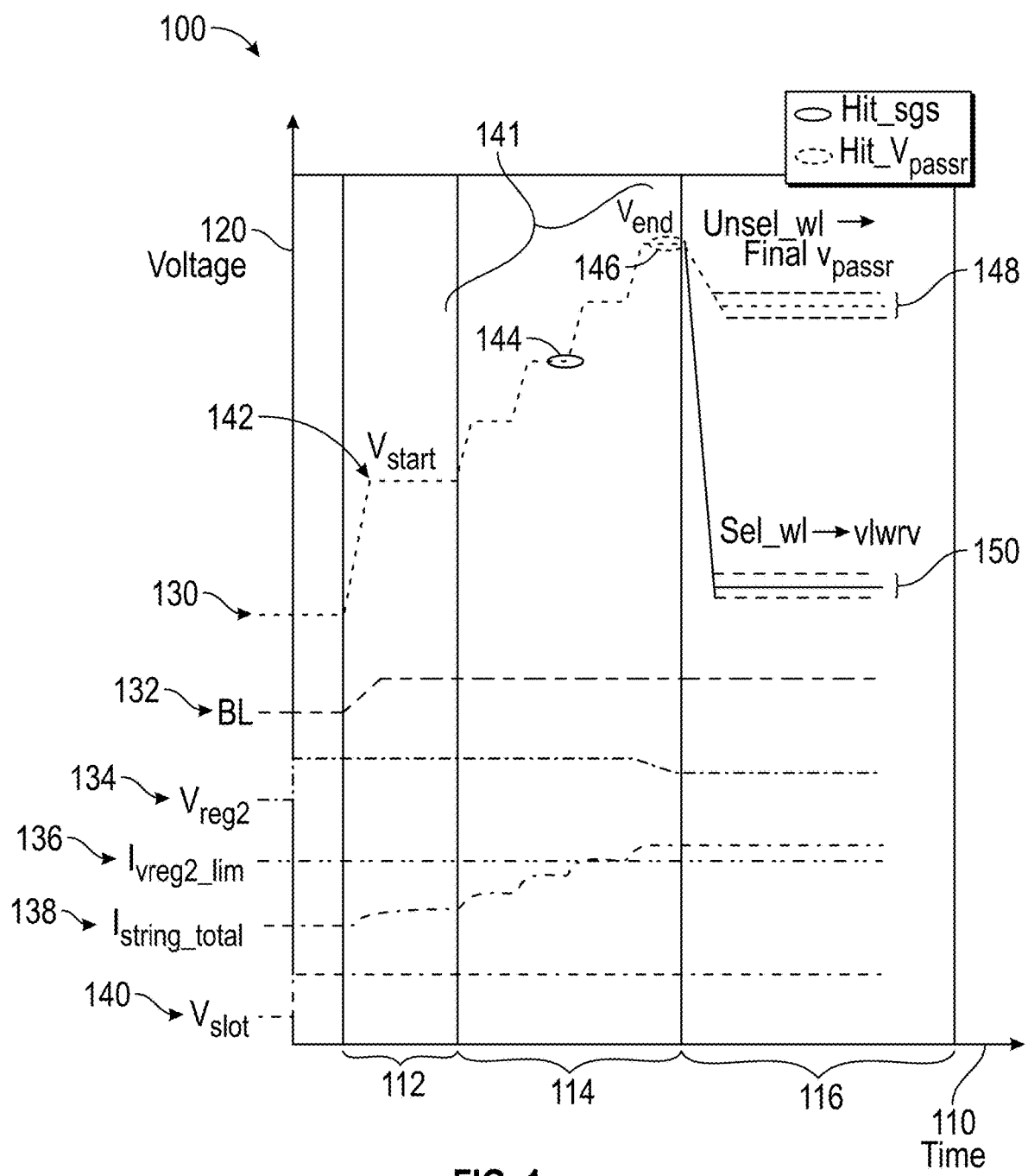
FIG. 1 depicts voltage waveforms associated with a memory system known in the art.

FIG. 1 depicts voltage waveforms associated with memory systems known in the art. Graph 100 of FIG. 1 depicts voltage along the vertical or Y axis 120 against time shown via the horizontal or X axis 110. Referring to FIG. 1, various waveforms are shown, including a pass voltage 130, a bitline (BL) voltage 132, a voltage regulation signal (Vreg2) 134 of the bitline pre-charging path, a current limit set for the Vreg2 signal driver (Ivreg2_lim) 136, a current set equivalent to the average string current expected (Istring_total) 138, and a slot voltage (Vslot) 140. These waveforms are shown along the time axis 110 as they transition from an initialization stage 112 through several sense stages 114, 116 during read operation on the word lines. This known use of varying pass voltage detection, also known as QCL (quick charge loss) tracking used to predict the shift of distributions downward with ageing, may be performed in the read operation during increase of the word line based on comparison of the total string current (Istring_total) 138 and the pull_up current limit, i.e., the set current level limit (Ivreg2_lim) 136. Such a scheme relies on the statistical distribution of final-level cells in a string, e.g., L15 cells for a 4-level NAND, and assuming a fully randomized distribution. Of course, for a 3-bit-per-cell device, L7 will be the final level. Here, the current limit set (Ivreg2_lim) 136 is equal to the average total string current (Istring_total) 138 expected when every string having N/(2/\M) cells has the desired final pass voltage (VpassR) at its gate, where N is the number of wordlines per string and M is the number of levels per page, i.e., 2/4/8 or 16. Here, it is noted that various examples and illustrations herein refer to L15, which assumes that there are 4 levels in the NAND.

Turning to operation, the wordlines are increased, at 141, from an initial start voltage (Vstart) 142 to an end voltage (Vend) 146 in steps in a sequence, at 141. At each step, along 141, total string current is compared against the set pull_up current limit (Ivreg2_lim) 136 associated with the voltage regulation signal (Vreg2) 134. At any given wordline step, at 141, if the total string current is greater than the current limit set for Vreg2 (i.e., Istring_total>Ivreg2_lim), then the final pass voltage (VpassR) is determined as a function of wordline voltage at that step. According to some aspects, the selected wordline voltage(s) for different levels are adjusted taking into account the QCL determined. Further, referring to FIG. 2, since hit_sgs 226 and the final pass voltage 228 (VpassR_final), the parameters associated with sub-block segmentation or turn-off (with regard to device reliability reasons), cannot be determined until the comparator flips, unselected sub-block segmentation cannot be done until the final pass voltage 148 is determined.

Figure 2A:
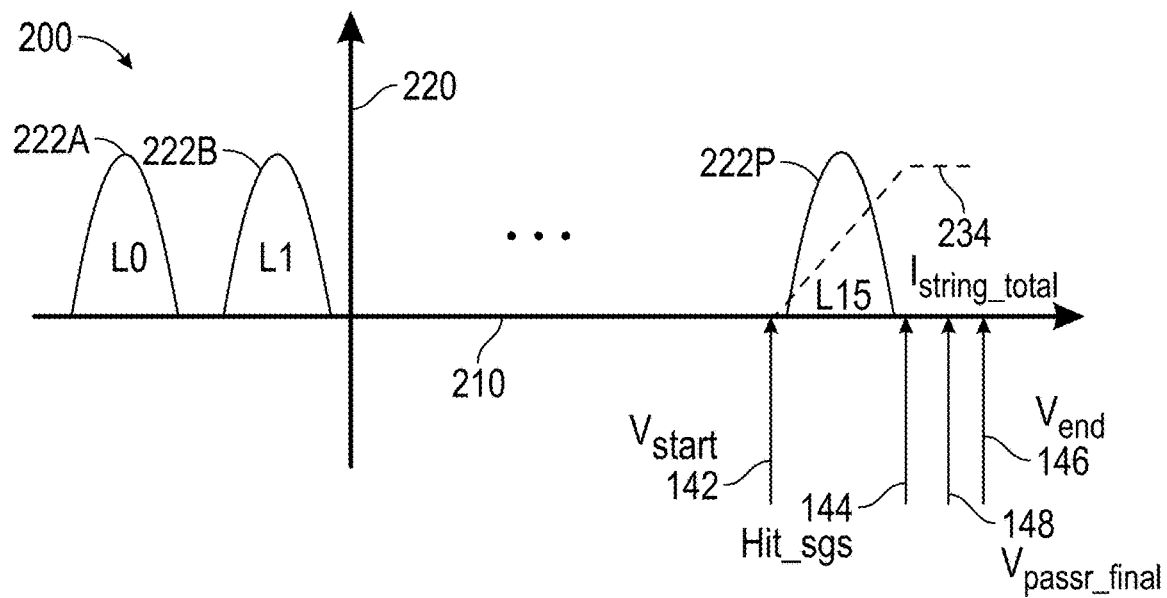
FIG. 2A depicts further voltage waveforms according to according to the memory system known in the art of FIG. 1.

FIG. 2A depicts further waveforms reflecting the distribution of cells according to an illustrative QLC or quad-level cell (4-bit-per-cell), i.e., L0 to L15, memory system, such as described in connection with FIG. 1. With regard to TLC or triple-level cell (3-bit-per-cell) devices, similar waveforms and characteristics would apply for L0 to L7. Graph 200 of FIG. 2A depicts number of cells at each voltage for each level along the vertical or Y axis 220 against voltage shown via the horizontal or X axis 210. Referring to FIG. 2A, distributions of each level are shown, namely waveforms 222A... 222P, e.g., for the series of sixteen levels, L0 through L15. FIG. 2A also includes a string current (Istring_total) waveform 234 showing the total string current expected as the wordline voltages are stepped from Vstart to Vend, as well as points along the X axis where certain levels, e.g. corresponding to voltage steps shown in FIG. 1, occur in connection with the distribution of one such memory level, L15. With regard to the waveform 222P of level L15, FIG. 2A shows the cell quantity when the start voltage 142 occurs, when the hit_sgs 144 occurs, when the final pass voltage (VpassR_final) 148 occurs, and when the end voltage (Vend) 146 occurs. Here, since hit_sgs 144 and the final pass voltage (VpassR_final) 148 cannot be determined until the comparator flips or calibration is finished, unselected sub-block segmentation or turn-off cannot be done until the final pass voltage (VpassR_final) is determined, at 148. Further, cell current variation with temperature can cause a variation or inaccuracy in the final pass voltage (VpassR_final) 148 or wordline read-verify voltages calculated, since temperature compensation is only performed at the desired sense current. Further, if different pages or sub-blocks are programmed at different times, ongoing calibration of the pass voltage (VpassR) and/or the wordline read-verify voltages (vwlrv) may also be inaccurate due to high currents from unselected sub-blocks during calibration. The average string current expected is also a function of the number of pages programmed per block, discussed further in connection with FIG. 2B.

Figure 2B:
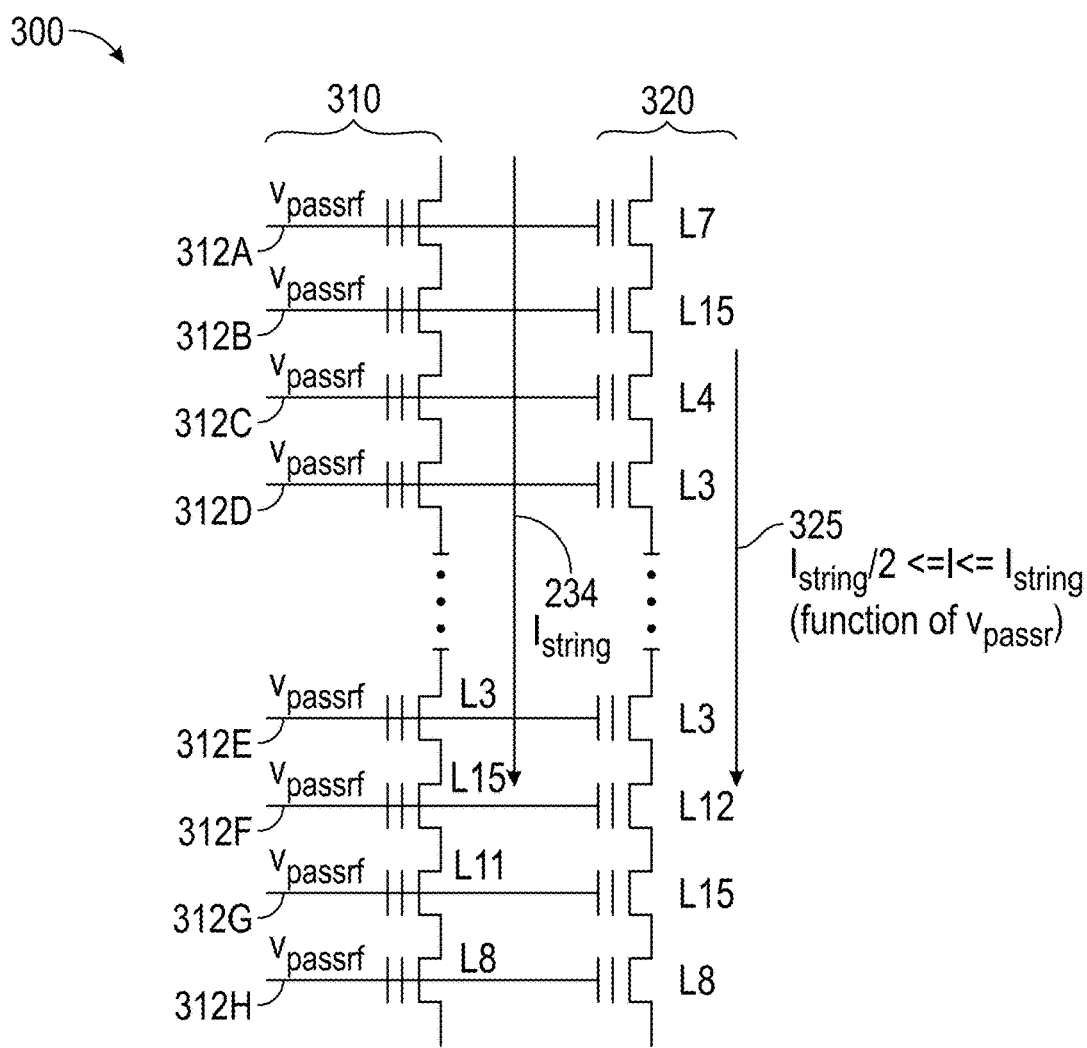
FIG. 2B depicts a circuit diagram representative of the memory system known in the art shown in FIGS. 1 and 2A.

FIG. 2B depicts a partial circuit diagram representative of the known memory systems described in connection with FIGS. 1-2A. The circuit diagram of FIG. 2B shows a memory block 300 that includes a first series or string of memory cells 310 that have a string current (Istring) 234, a second series or string of memory cells 320 that have a string current 325, and the pass voltages (Vpassrf) 312A... 312H being supplied to the series of cells. FIG. 2B illustrates differences in cell pattern, here, where the first string 310 contains only one L15 cell, while the second string 320 contains two L15 cells. Here, then, as the number of L15 cells per strings vary, the current contribution per string changes. In the illustrated example, the average expected string current may be calculated as the total string current (sum of the current in both strings) divided by 2 (total number of strings). Further, since the current of the strings 310,320 will decrease as a function of a greater quantity of L15 cells being programmed per string (i.e., via transistors triggered by VpassR), the current of each string is based on the quantity of pages being programmed. Here, the average string current expected is also a function of the number of pages programmed per block. Further, this dependency helps show how fluctuation in cell currents can affect calibration efforts. For example, if different pages or sub-blocks are programmed at different times, ongoing calibration of the pass voltage (VpassR) and/or the wordline read-verify voltages (vwlrv) may also be inaccurate due to high currents from unselected sub-blocks, which can result in unsatisfactory average expected string current calculation and resulting calibration/performance.

Figure 3:
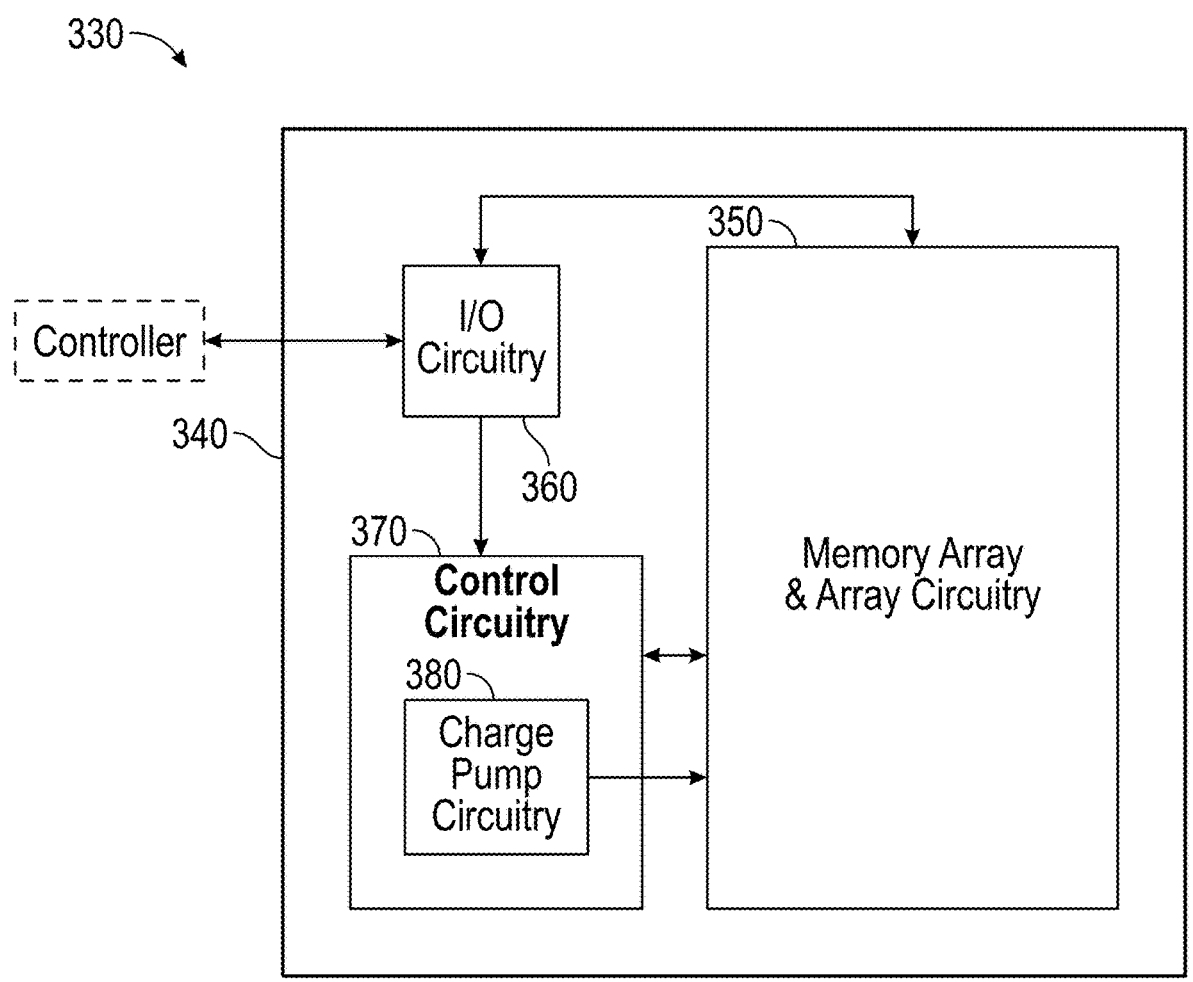
FIG. 3 is a block diagram of a memory according to embodiments of the disclosure.

FIG. 3 is a block diagram 330 of a memory 340 according to embodiments of the disclosure. The memory 340 includes a memory array and array circuitry 350 with a plurality of memory cells that are configured to store data. The memory cells may be accessed in the array through the use of various signal lines, for example, global word lines (GWLs), local word lines (LWLs), and bitlines (BLs). The memory cells may be non-volatile memory cells, such as NAND or NOR flash cells, phase change memory cells, or may generally be any type of memory cells. The memory cells may be single level cells configured to store data for one bit of data. The memory cells may also be multi-level cells configured to store data for more than one bit of data.

Commands, address information, and write data may be provided to the memory 340 as sets of sequential input/output (I/O) transmitted via I/O circuitry 360. Similarly, read data may be provided from the memory 340 through the I/O circuitry 360. The I/O circuitry 360 may route data signals, address information signals, and other signals between an I/O bus and internal buses and registers such as a command register and an address register, which may be provided address information by the I/O circuitry to be temporarily stored.

The memory 340 also includes control circuitry 370 that receives a number of control signals either externally (e.g., CE#, CLE, ALE, CLK, W/R#, and WP#) or through a command bus to control the operation of the memory 340. The command register stores information received via the I/O circuitry and provides the information to the control circuitry 370. The control circuitry 370 may be configured to provide internal control signals to various circuits of the memory 340. For example, responsive to receiving a memory access command (e.g., read, write, program), the control circuitry 370 may provide internal control signals to control various memory access circuits to perform a memory access operation. The various memory access circuits are used during the memory access operation, and may generally include circuits such as row and column decoders, charge pump circuitry 380, signal line drivers, data and cache registers, I/O circuits, as well as others.

The memory array and array circuitry 350 is coupled to the address register, which provides block-row address signals to a row decoder and column address signals to a column decoder. The row decoder and column decoder of the memory array and array circuitry 350 may be used to select blocks of memory cells for memory operations, for example, read, program, and erase operations. The row decoder and/or the column decoder may include one or more signal line drivers configured to provide a biasing signal to one or more of the signal lines in the memory array. The signal line drivers may drive the signal lines with a pumped voltage that is provided by charge pump circuitry 370. The charge pump circuitry 370 may provide different voltages used during operation of the memory 340, for example, during memory access operations. The voltages provided by the charge pump circuitry 340 may include voltages that are greater than a power supply voltage provided to the memory 340, voltages that are less than a reference voltage (e.g., ground) provided to the memory 340, as well as other voltages.

Figure 4:
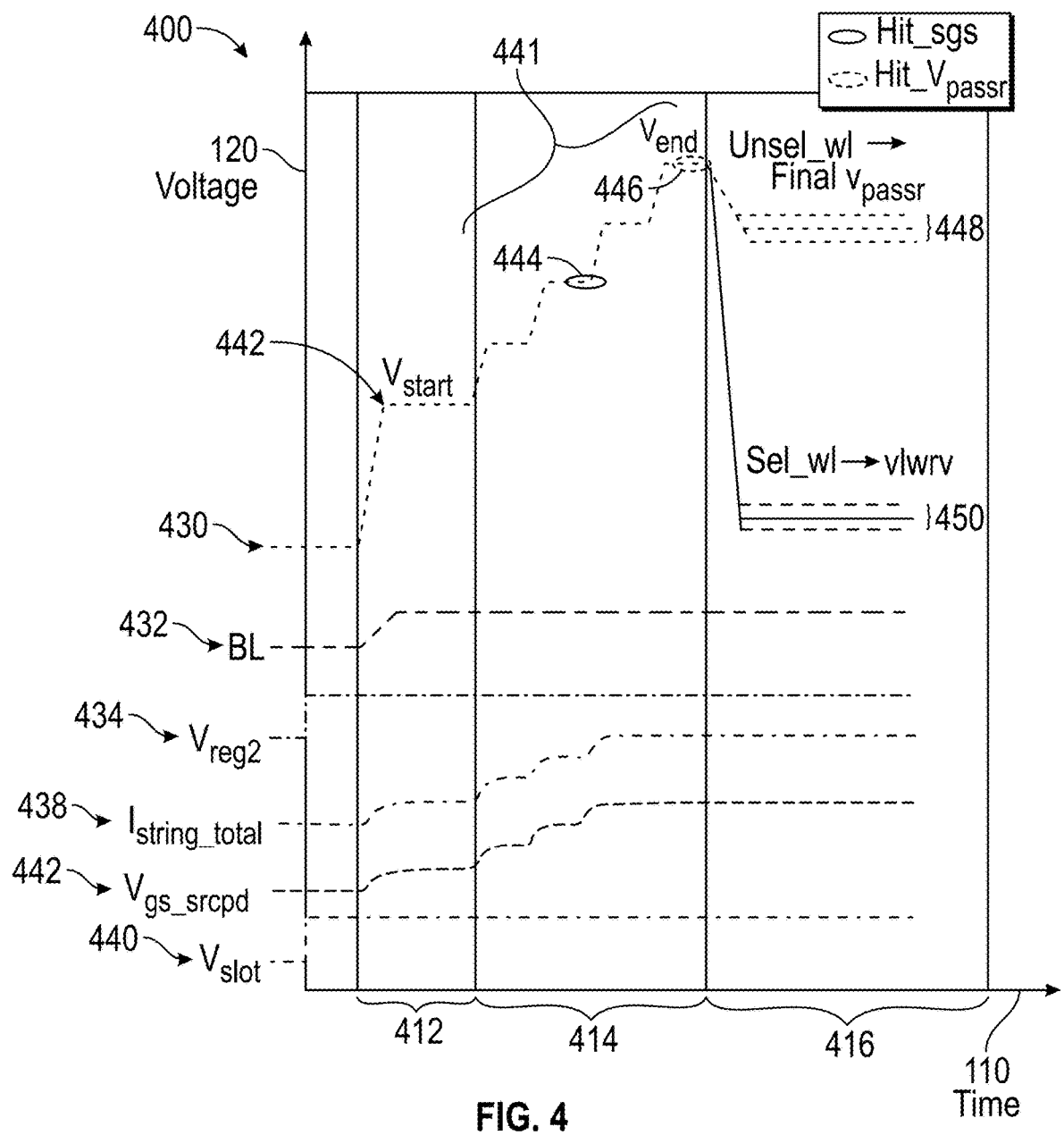
FIG. 4 depicts voltage waveforms associated with a memory implementation according to some embodiments of the disclosure.

FIG. 4 depicts voltage waveforms associated with a memory system according to some embodiments of the disclosure. Graph 400 of FIG. 4 depicts voltage along the vertical or Y axis 120 against time shown via the horizontal or X axis 110. Referring to FIG. 4, various waveforms are shown, including a pass voltage 430 applied to all the wordlines, a bitline voltage (BL) 432, a voltage regulation signal (Vreg2) 434, i.e., of the bitline pre-charging path, a total string current (Istring_total) 438, a source pull down voltage 442 such as a gate-to-source voltage of the pull down device in the source (SRC) or slot voltage regulator, Vgs_srcpd, which sinks the total string current, and a slot voltage (Vslot) 440. An exemplary slot or source voltage regulator is shown in FIG. 6A. These waveforms are shown along the time axis 110 as they transition from an initialization stage 412 through several sense stages 414, 416 during read operation on the word lines. Turning to operation, the wordlines are increased, at 441, from an initial start voltage (Vstart) 442 to an end voltage level (Vend) 446 in steps in a sequence, at 441. The slope change in regard to total string current, according to various innovations herein, is measured at every step and compared against a threshold, such as a predetermined threshold, to determine the final pass voltage (Vpass_final) based on the wordline voltage at which the change in total string current (delta_Istring_total) reaches (e.g., falls below) the threshold, as detailed further in connection with FIG. 5.

Accordingly, dynamic pass voltage detection, or QCL tracking, consistent with the disclosed innovations is performed in the read operation during increase of the word line, though based on detecting the total string current roll-off. Since detection accuracy of the present innovations relies on detecting the current slope change, rather than average current, prior cell current temperature compensation issues have no impact on accuracy. Further, reliance on detecting such current slope change enables aspects of the present innovations to be insensitive to other factors, such as one or more of quantity of pages programmed, sample size, and/or differing delay such as time-dependence on programming speed.

Figure 5:
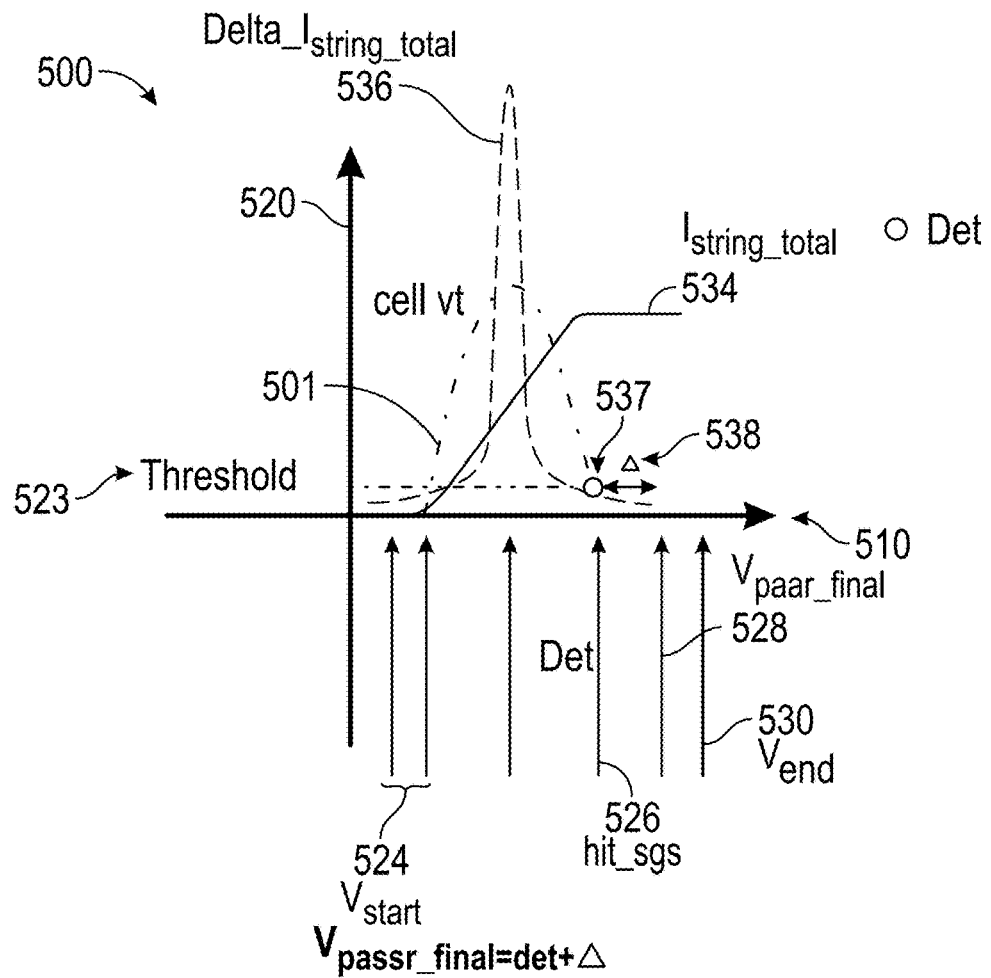
FIG. 5 depicts further voltage waveforms associated with a memory implementation consistent with FIG. 4 according to some embodiments of the disclosure.
Figure 6A:
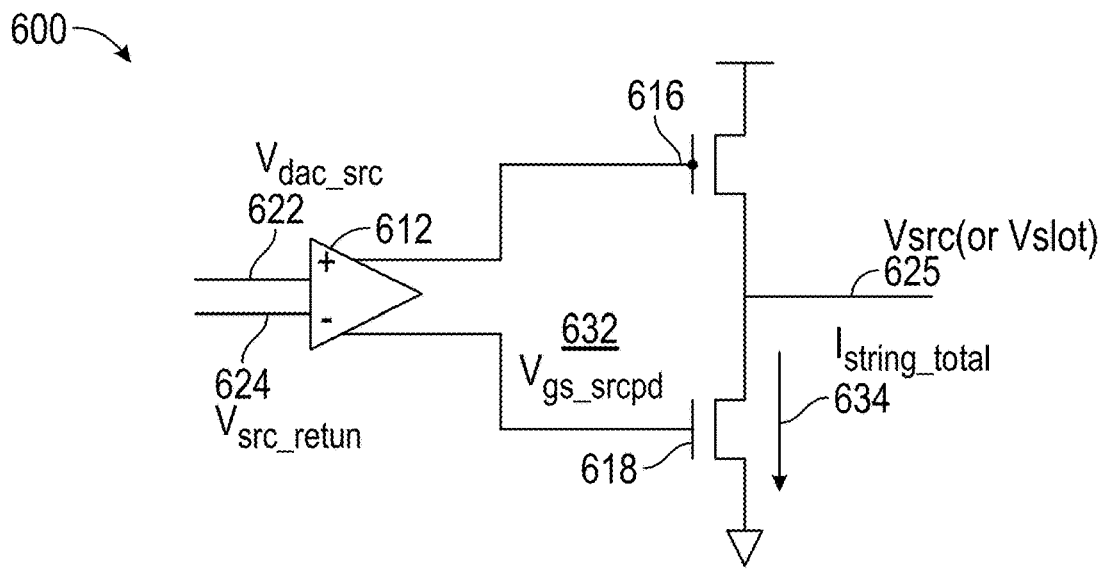
FIG. 6A depicts representative circuitry, such as a driver or regulator, associated with a second memory implementation according to further embodiments of the disclosure.

FIG. 5 depicts a graph 500 of voltage waveforms associated with a memory implementation consistent with FIG. 4, according to some embodiments of the disclosure. Graph 500 of FIG. 5 shows a bell-shaped waveform 501 of the L15 level distribution, a waveform of the string current 534, the change regarding total string current 536, a threshold 523 against which the change regarding total string current is compared, as well as the points in time at which the start voltage(s) 524, the hit_sgs voltage 526, the final pass voltage (VpassR) 528, and the end voltage (Vend) 530, of the wordline as it is increased (i.e., along 441), occur. As set forth above, the wordlines are increased from a predetermined start voltage (Vstart) 524, to an end voltage (Vend) 530 in steps along a sequence, at 441. The change in total current, or roll-off, 536 is determined by measuring slope change at every step and comparing the calculated value against the threshold 523 to determine the final pass voltage (VpassR_final) based on the wordline voltage at which the roll-off (delta_Istring_total) reaches (e.g., falls below) the threshold 523, as shown at 537 in FIG. 5. Again, here, use of the changing in slope of the string current 536 enables aspects to be insensitive to other factors, such as quantity of pages programmed, sample size, or time-dependence of programming.

Additionally, in further embodiments, the change in slope (delta) or roll-off of the total string current may be obtained or measured in different ways to even further enhance performance under certain conditions.

Figure 8:
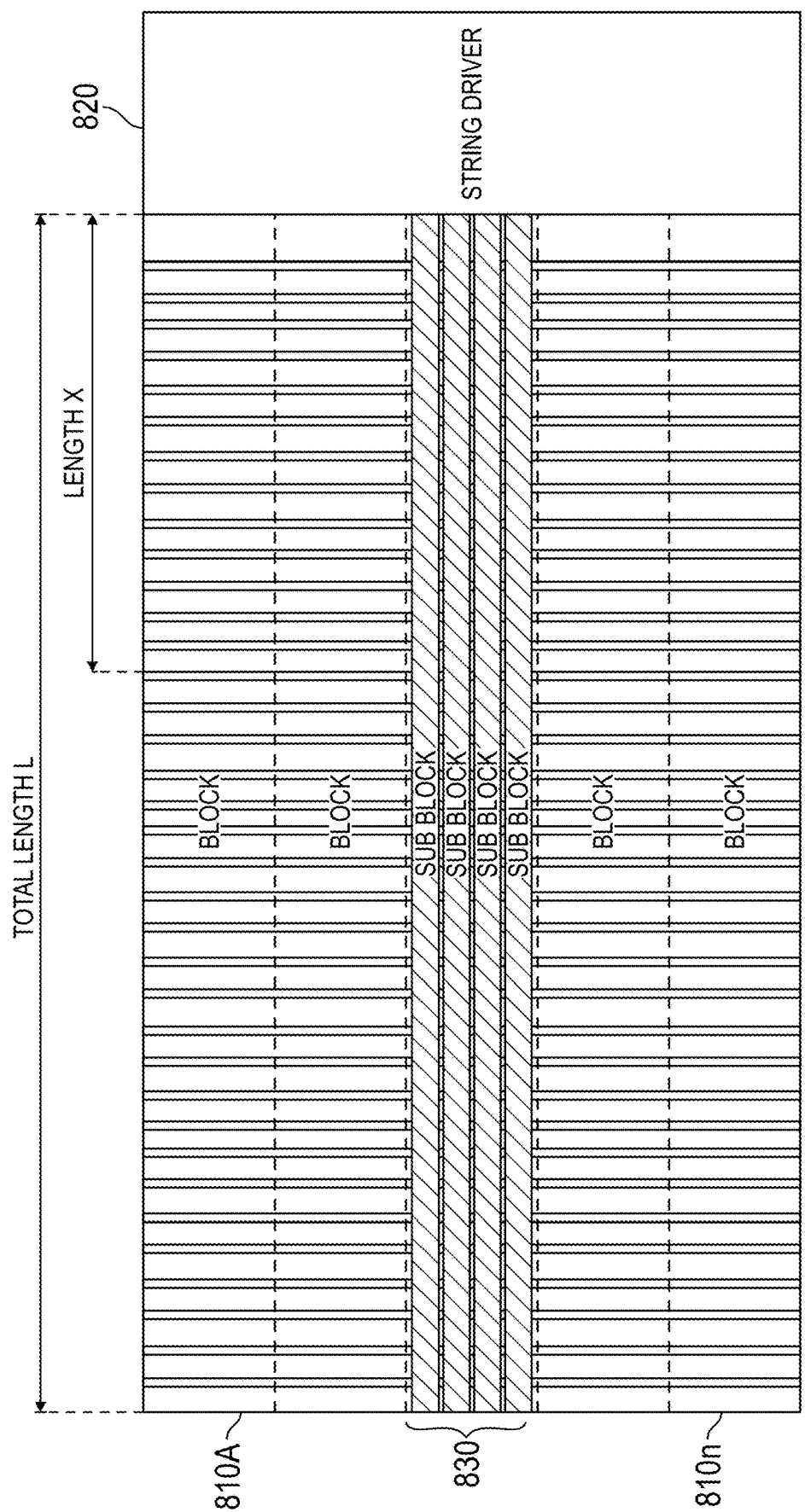
FIG. 8 depicts an exemplary NAND block diagram according to embodiments of the disclosure.

FIG. 6A depicts representative circuitry 600 of a Vslot (or Vsrc) driver or regulator that sinks the total string current, as associated with a second such memory implementation of the disclosure. In particular, FIG. 6A illustrates one possible implementation wherein the roll-off is measured only for the first few strings closer to the string driver, such as the first ~2Kb strings closer to the string driver. Here, for example, such roll-off is measured by looking at Vgs_srcpd changes as the wordline steps from Vstart to Vend. FIG. 8 depicts an exemplary NAND block diagram that helps illustrates aspects of such features. FIG. 8 illustrates blocks of memory cells 810A ... 810n, an associated string driver 820, as well as sub-blocks closer to the string driver 820, such as those within an "X" 825 distance, ratio or other measure relative to the string driver or to total length, L. In further embodiments, the roll-off may be measured only for the first few strings closer to the string driver. In one example, the roll-off may be measured for about ¼ or 25% of the strings closest to the driver. In another example, the roll-off may be measured for about ¼ of the wordline closest to the string driver. In still another example, the roll-off may be measured for about the first 10% of the strings closer to the string driver. In yet another example, the roll-off may be measured for the cells that represent the first ~10% of the total RC response. Turning back to FIG. 6A, the circuitry 600 shown is a sub-circuit including an operational amplifier 612 and a transistor pair comprised of a first transistor 616 and a second transistor 618 between Vsrc and ground, through which the total string current 634 passes. The operational amplifier 612 is provided with a first voltage such as a reference voltage (e.g., Vdac_src, etc.) at which we want to regulate Vslot or Vsrc, on the first node, as well as a second voltage, Vsrc_return, on the feedback node fed back from the Vsrc (or Vslot) grid. In operation, this yields a Vgs_srcpd across the second transistor 618 of the transistor pair, which in turn, provides a source voltage (Vsrc) at the output of the memory cell. Here, the total string current 634 used to determine slope change will be of reduced size (hence, reduced components and/or complexity), a smaller sum, and thus allow for faster assessment(s). According to one illustration above, for example, when only 2KB cells are sensed, total string current is smaller which means lesser Icc. Accordingly, this allows for faster calibration because the associated wordline RC effects are eliminated.

FIG. 6B depicts a representative waveform associated with such second memory system implementation according to further embodiments of the disclosure. Referring to FIG. 6B, Vgs of the source pull down voltage (e.g., Vgs_srcpd) 646 corresponding to the total string current being detected is shown mapped against time along the horizontal or X axis and voltage along the vertical or Y axis. FIG. 6B illustrates the increase in Vgs_srcpd voltage as it is incremented at each time-wise step (t0, t1, t2, t3, t4) associated with the increase in string current upon which the slop calculated is based. Here, then, Vgs_srcpd is amplified and the rate of change of Vgs is computed to determine where the measured slope/change 536 reaches (e.g., goes lower than, etc.) the threshold 523, to determine the final pass voltage (VpassR) and/or wordline read-verify voltages (Vwlrv).

FIG. 6C depicts another circuit diagram 650 illustrative of such second memory system implementation according to further embodiments of the disclosure. The circuit diagram 650 of FIG. 6C depicts representative logic of an illustrative comparator used to calculate roll-off, showing how components of Vgs_srcpd 658,662 associated with the strings being measured may be compared via 654, to provide the detected voltage (Vdetect) at output 664. In FIG. 6C, the Vgs_srcpd signal, at 656, is amplified 652 and then switched, at 653, to provide its value at 2 times (tn and tn-1) along lines 658,662 provided as inputs to the comparator 654. The output of the comparator 654 produces a logic high detect signal (Vdetect) 664, when the Vgs_srcpd switched at (Vgs_srcpd_tn-1) plus the threshold 523, as indicated in FIG. 6C via (Vgs_srcpd_tn-1) 662 + Threshold 553 is greater than Vgs_srcpd_tn. Accordingly, systems and methods consistent with such second implementation are configured to speed up detection, overcome issues associated with wordline RC (resistive-capacitive) effects, and/or lower the current demand (Icc) utilized in operation.

Figure 7:
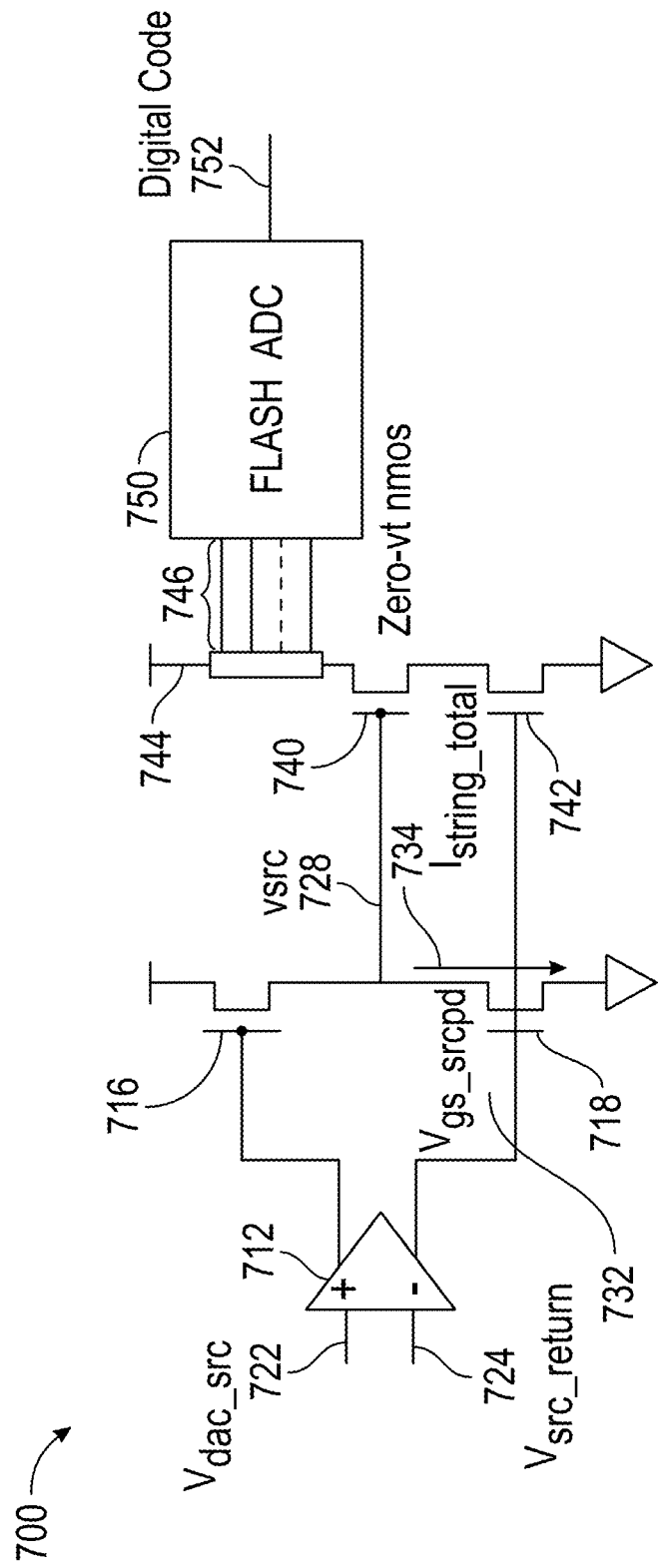
FIG. 7 depicts a representative circuit diagram associated with a third memory implementation according to still further embodiments of the disclosure.

FIG. 7 depicts a representative circuit diagram 700 associated with a third memory implementation according to still further embodiments of the disclosure. The circuit diagram 700 of FIG. 7 illustrates various components consonant with FIG. 6A, including: an initial operational amplifier 712 provided with a first voltage 722, such as a source voltage (Vdac_src), at the first (reference) terminal and a second voltage 724, such as a source/return voltage (Vsrc_return) at the feedback node tapped off the SRC grid, at the second terminal; a transistor pair 716,718; and an output 728 providing the source voltage. In general, each string contributes a current which is dependent on the number of highest-level cells (e.g., L15 or L7, etc.), and total string current 734 would be the sum of currents passing through all the strings. According to the third implementation depicted in FIG. 7, however, the circuitry 700 further includes a flash ADC (analog-to-digital converter) module 750 to detect the slope change and provide an associated digital output, at 752, for subsequent processing. In the example circuity 700 shown, the string current (Istring_total) 734 associated with the source pull-down voltage (e.g., Vgs_srcpd) measured may be amplified, e.g., via transistors 718,742 and 734, and the corresponding amplified analog signals are provided, at 746, through a resistor to the flash ADC 750. In operation, a digital code is generated for every current via the ADC 750 and the difference of digital codes is used to determine roll-off.

The subject matter disclosed above may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Those skilled in the art will recognize that the methods and devices of the present disclosure may be implemented in many manners and as such are not to be limited by the foregoing exemplary embodiments and examples. In other words, aspects/elements can be performed by single or multiple components, in various combinations and/or sub-combinations, and individual aspects, may be distributed among components and/or subcomponents. In this regard, any number of the features of the different embodiments described herein may be combined into single or multiple embodiments, and alternate embodiments having fewer than, or more than, all the features described herein are possible.

While various embodiments have been described for purposes of this disclosure, such embodiments should not be deemed to limit the teaching of this disclosure to those embodiments. Various changes and modifications may be made to the elements and features described above to obtain a result that remains within the scope of the systems and processes described in this disclosure.

The invention claimed is:

1. A method of memory control comprising:
increasing wordlines, during memory operation, in a series of steps from a start voltage to an end voltage;
calculating a total string current at each of the steps;
determining a change in slope of the total string current over time, calculated for the steps;
comparing the determined change in slope, at each step, against a threshold;

determining an adjusted memory control voltage based on a wordline voltage corresponding to a point at which the determined change in slope reaches the threshold; and dynamically calibrating the memory control voltage, wherein the memory control voltage is calibrated with reduced sensitivity to changes in one or more operating parameters associated with the memory as a function of using the change in slope to determine the adjusted memory control voltage.

2. The method of claim 1 wherein the memory operation comprises a read or write operation of the memory array.

3. The method of claim 1 wherein the memory control voltage that is calibrated consists of at least one of a pass voltage and a wordline read-verify voltage.

4. The method of claim 1 wherein the one or more operating parameters consist of at least one of temperature, pattern, and time of programming.

5. The method of claim 1 wherein calculating the total string current comprises summing string current for all memory sub-blocks within a memory cell.

6. The method of claim 1 wherein calculating the total string current comprises summing string current for only memory sub-blocks closer to an associated string driver.

7. The method of claim 6 wherein calculating the total string current comprises summing string current for only memory sub-blocks within a first few strings close to the string driver.

8. The method of claim 6, wherein calculating the total string current comprises summing string current for only memory sub-blocks within 2,000 bytes close to the string driver.

9. The method of claim 6 wherein calculating the total string current comprises summing string current for only memory sub-blocks within 25% of the strings close to the string driver.

10. The method of claim 6 wherein calculating the total string current comprises summing string current for only memory sub-blocks within 10% of the strings close to the string driver.

11. The method of claim 1 wherein the change in slope of the total string current is determined via a flash analog-to-digital converter.

12. The method of claim 1 wherein the memory operation comprises a read or write operation in a NAND memory array.

13. A system comprising:
a memory array including a plurality of memory cells, the memory cells being arranged in rows or sets of cells each defining a string current;
control circuitry coupled to wordlines connected to the memory cells, the control circuitry proving memory control voltages to the wordlines and configured to:
increase voltages on the wordlines, during memory operation, in a series of voltage steps from a start voltage to an end voltage;
calculate a total string current at each of the voltage steps;
determine a change in slope of the total string current over time, calculated for the voltage steps;
compare the determined change in slope, at each voltage step, against a threshold;
determine an adjusted memory control voltage based on a wordline voltage corresponding to a point at which the determined change in slope reaches the threshold; and dynamically calibrate the memory control voltage with reduced sensitivity to change in one or more operating parameters.

14. The system of claim 13 wherein the control circuitry is associated with read or write operation of the memory array.

15. The system of claim 13 wherein the memory array comprises NAND memory, and the plurality of memory cells are arranged as strings of memory cells in series.

16. The system of claim 15, further comprising an operational amplifier associated with a source voltage or slot voltage of the memory cells.

17. The system of claim 16, wherein the operational amplifier is coupled a reference voltage.

18. The system of claim 17 wherein the reference voltage comprises a source voltage, which is used to regulate the source voltage or the slot voltage.

19. The system of claim 16, the control circuitry further comprising a second operational amplifier utilized to step the read control voltage to the voltage steps, wherein the second operational amplifier is provided with a source pull down voltage as input and an output of the second operational amplifier is utilized to detect the slope change.

20. The system of claim 15, wherein the control circuitry is configured to calculate the total string current by summing string current only for a reduced set of memory sub-blocks closer to the string driver.

21. The system of claim 20, wherein the reduced set of memory sub-blocks comprise sub-blocks within 2,000 byte strings close to the string driver.

22. The system of claim 20 wherein the reduced set of memory sub-blocks comprise sub-blocks within 25% of the strings close to the string driver.

23. The system of claim 20 wherein the reduced set of memory sub-blocks comprise sub-blocks within 10% of the strings close to the string driver.

24. The system of claim 15, the control circuitry further comprising:
one or more transistors coupled to a source voltage or slot voltage of the memory cells, wherein the one or more transistors are used to amplify the read control current of the source pull down; and
a flash analog-to-digital converter coupled to the transistors and receiving the amplified current, wherein the flash analog-to-digital converter computes a digital code based on the amplified current to detect the slope change.

25. The system of claim 13 wherein the one or more operating parameters consist of at least one of temperature, pattern, and time of programming.

26. A method for calibrating a memory control voltage, the method comprising:
increasing wordlines in a series of steps from a start voltage to an end voltage;
calculating a total string current at each of the steps;
determining a change in slope of the total string current over time, calculated for the steps;
comparing the determined change in slope, at each step, against a threshold; and
determining an adjusted memory control voltage based on a wordline voltage corresponding to a point at which the determined change in slope reaches the threshold.

* * * * *

UNITED STATES PATENT AND TRADEMARK OFFICE
CERTIFICATE OF CORRECTION

PATENT NO. : 10,741,260 B1
APPLICATION NO. : 16/424448
DATED : August 11, 2020
INVENTOR(S) : Kalyan Kavalipurapu, Michele Piccardi and Xiaojiang Guo Page 1 of 1

It is certified that error appears in the above-identified patent and that said Letters Patent is hereby corrected as shown below:

In the Claims

Column 9, Line 52: in Claim 13, replace "proving" with --providing--.

Signed and Sealed this
Sixth Day of October, 2020

Andrei Iancu
*Director of the United States Patent and Trademark Office*